United States Patent [19]

Kasai et al.

[11] Patent Number: 4,730,158

[45] Date of Patent: Mar. 8, 1988

[54] ELECTRON-BEAM PROBING OF PHOTODIODES

[75] Inventors: Ichiro Kasai, Santa Barbara; Roderic L. Osgood, Goleta; Charley B. Burgett, Santa Barbara; Richard J. Joyce, Thousand Oaks; Michael D. Warfield, Oxnard, all of Calif.

[73] Assignee: Santa Barbara Research Center, Goleta, Calif.

[21] Appl. No.: 871,231

[22] Filed: Jun. 6, 1986

[51] Int. Cl.⁴ .................... G01R 31/26; G01R 31/28
[52] U.S. Cl. ............................ 324/158 R; 324/73 R; 324/158 D
[58] Field of Search .............. 324/158 R, 158 D, 71.3, 324/73 R; 250/310, 311

[56] References Cited

U.S. PATENT DOCUMENTS 4,413,181 11/1983 Feuerbaum ................. 324/158 D
4,456,880 6/1984 Warner et al. ............... 324/158 D Primary Examiner—Ernest F. Karlsen
Attorney, Agent, or Firm—Ronald L. Taylor; A. W. Karambelas

[57] ABSTRACT

Method and apparatus for testing photodiode arrays using an electron beam. The diodes are charged at successive intervals over the RC time constant curve to develop successively increasing voltages at the ends of succeeding time intervals. Diode voltage and current are measured at the end of each interval and the resulting data are used to develop a current-voltage characteristic for each diode.

20 Claims, 5 Drawing Figures

ELECTRON-BEAM PROBING OF PHOTODIODES

BACKGROUND OF THE INVENTION

1. Field of the Invention

This invention relates to quality control testing of electronic circuitry and, more particularly, to equipment and methods for the non-destructive testing of integrated circuits, using a focused electron beam in making current/voltage measurements on photodiode arrays.

2. Description of Related Art

The development of photodiode arrays comprising large numbers of individual elements is becoming increasingly important in certain specific applications. For quality assurance, it is virtually essential that screening of a fabricated photodiode array on an individual element basis be performed prior to incorporation of the array in utilization equipment. Heretofore, such screening has been performed by mechanical probing of the elements, usually on a single element basis. The results of such a procedure are less than satisfactory. Delicate indium bumps which are provided for circuit test contacts are easily damaged by a contacting probe. The procedure is a very time-consuming operation. A further disadvantage is that the results of the procedure are extremely operator dependent.

Given the nature of the problem—small detector size (approximating 1.5×1.5 mils) of typical multi-element hybrid focal plane arrays and the delicate character of the indium interconnects—some type of non-contacting method of diode probing is desired, preferably one which can be automated or at least performed in a way which provides results independent of operator parameters.

A system has been developed which uses an electron beam integrated circuit tester for testing the internal nodes of a complex integrated circuit. This system incorporates electron beam apparatus which focuses and directs the electron beam to selected internal nodes and detects secondary electron emission therefrom with associated computerized control circuitry. As thus controlled, the electron beam apparatus provides high speed access and testing of the integrated circuit nodes.

In one version of the system, the probe intelligently chooses a limited number of the internal nodes which are considered most likely to indicate circuit failure so as to minimize the number of nodes tested while maximizing reliability of the results. The probe comprises an artificial intelligence which understands the design and operation of the integrated circuit under test, the intelligence being embodied in a programmed computer associated with the probe. The system further includes circuitry for accessing the peripheral pads of the integrated circuit under test and for applying the proper circuit biases, clock signals and test signals under control of the computer. In such a system, the movement of the electron beam between selected internal nodes of the circuit and the operation of the associated computer to select those nodes are decisions which may be made in a matter of microseconds or milliseconds.

The electron beam of the test apparatus, when focused on a single selected node within the circuit, creates secondary electron emission having an energy distribution which is affected by the properties of the node on which the electrons of the primary beam impinge. A suitable sensor responds to the secondary electron energy distribution, permitting the computer to sense and store the voltage of the node under test.

A particular advantage of such a system is that the probe does not capacitively load any of the internal nodes of the integrated circuit under test, nor does it damage them. At the same time, the electron beam of the probe has a submicrometer diameter and is fast and easy to position with great precision. Because of these advantages, use of this system as an off-line design verification and failure analysis tool for integrated circuit development is one practical application. For photodiode probing, the high speed with which the nodes may be selected and tested is appropriate for the use of the system on a production line having high product through-put. This method is cost effective and is inherently more reliable than the conventional testing methods outlined hereinabove.

SUMMARY OF THE INVENTION

Arrangements in accordance with the present invention utilize a focused electron beam (E-beam), similar to that described above, in making high speed current-/voltage (I-V) measurements on photodiode arrays. However, instead of directing the electron beam to internal circuit nodes, the beam is used to access the free electrode of a selected diode in the array. The E-beam is used to direct electrons to the selected diode, developing a predetermined voltage thereon. The corresponding current of the diode is measured through the completion of a circuit path from the diode substrate to a common diode substrate node which is accessible at the edge of the photodiode array. I-V measurements of an array of diodes are accomplished by sequentially scanning the E-beam from one diode to another within a given scan field. Precision registration of the focused E-beam is achieved by providing cross marks on the diode array by means of $Ni/SiO_2$ contrast. Low background and low temperature test conditions which are established for one particular application of interest permit I-V curve measurements of photodiodes in the infrared region.

Measurement of diode voltage, as derived from the secondary emission electrons, is developed by the use of a voltage contrast sensor. In one particular arrangement in accordance with the invention this sensor comprises an energy filter followed by a scintillator, positioned in the region of deflected secondary emission electron flux, which converts the secondary electrons into photons. An associated photomultiplier tube generates a corresponding multiplied photocurrent which is amplified to provide the voltage contrast signal.

Duty cycle modulation of the E-beam current causes a variation of the diode current with time, and measurement of the resultant diode voltage provides the data for the I-V curve of the diode under test. The time required for mapping the I-V curve on a single diode is closely related to the values of diode capacitance and resistance. The latter largely depends on diode quality, background and operating temperatures. With the aid of computer data acquisition, a period on the order of 0.1 to 1 second is required for one I-V measurement. Thus, an extended photodiode array can be tested within a reasonably short period of time. The data derived from the testing of each diode, if plotted, develops an I-V curve which is compared with comparable data from a diode of known acceptable quality; and the decision to accept or reject the array containing the tested diodes may be made on the basis of acceptable deviations from the norm.

BRIEF DESCRIPTION OF THE DRAWINGS

A better understanding of the present invention may be realized from a consideration of the following detailed description, taken in conjunction with the accompanying drawing in which.

DESCRIPTION OF THE PREFERRED EMBODIMENT

Figure 1:
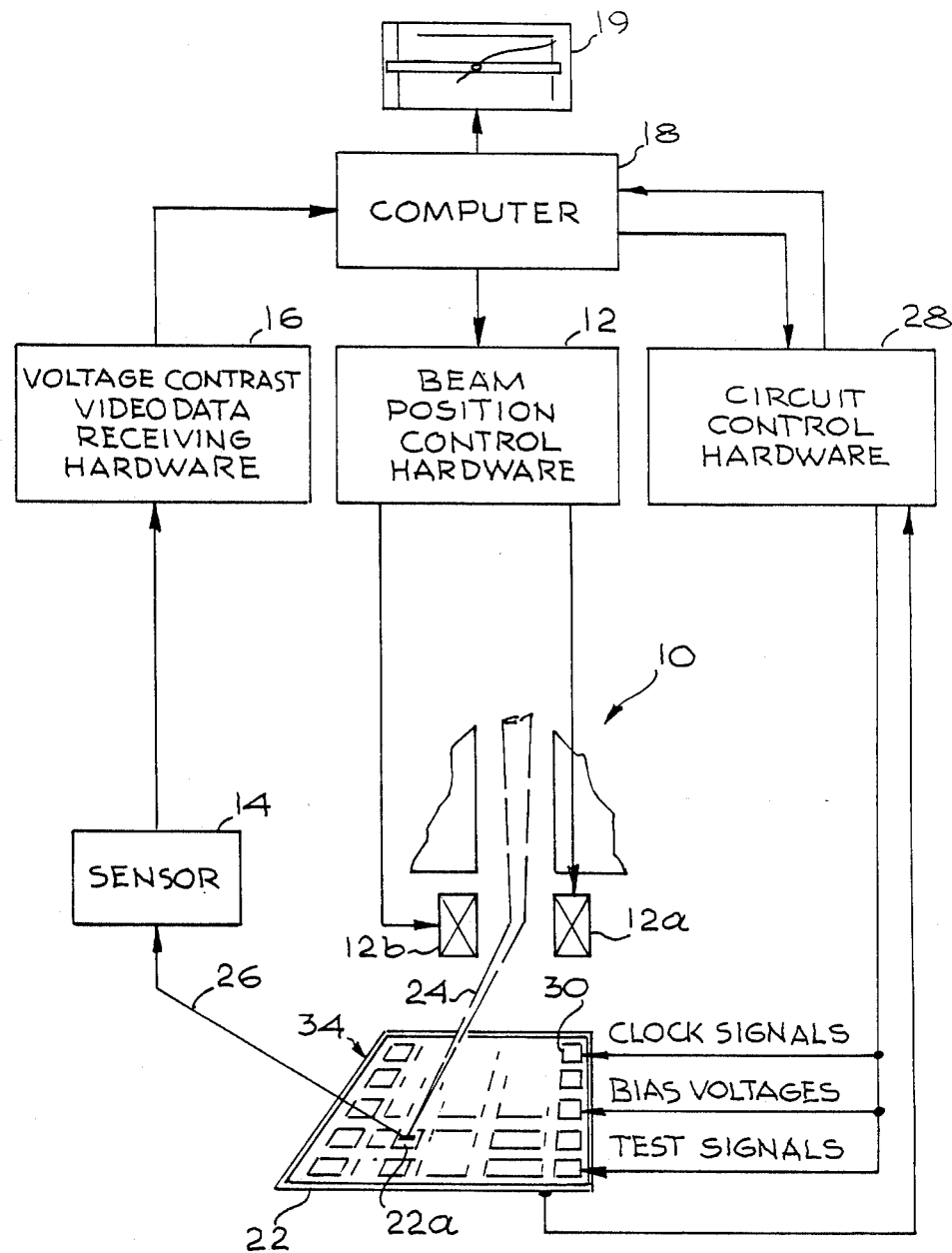
FIG. 1 is a schematic block diagram of one particular arrangement in accordance with the invention.

The schematic block diagram of FIG. 1 represents an overall system in accordance with the present invention for E-beam testing of photodiode arrays. In FIG. 1, an electron beam generator 10 is shown in association with beam position control hardware 12 which includes deflection coils 12a and 12b, together with a secondary electron emission sensor 14 and associated voltage contrast video data receiving hardware 16. A computer 18 is coupled to control the beam position hardware 12 and the voltage contrast hardware 16. A plotter 19 is coupled to the computer 18 as an output device. The correlated data is processed by the computer 18 which controls the plotter 19 to produce the I-V curve for the photodiode under test.

An electron beam 24 from the beam generator 10 is directed toward the array 22, instantaneously to a single photodiode 22a thereof, to create secondary electron emission 26 which is received at the detector 14. The array 22 is activated by means of circuit control hardware 28, also controlled by the computer 18. The circuit control hardware 28 generates clock signals, test signals and bias voltages which are applied to appropriate pads 30 along the periphery of the array 22 to complete the test circuit paths and also measures individual diode current for inputting to the computer 18 where it is correlated with corresponding diode voltage data from the voltage contrast hardware 16.

The computer 18 selects a particular diode 22a to be tested and directs the circuit bias input signal hardware 28 to apply appropriate clock signals, bias voltages and test signals to the appropriate ones of the paths 30; it also causes the beam position control hardware to direct the electron beam 24 to focus on the particular selected diode 22a. Secondary electrons are emitted from the diode 22a and are detected by the sensor 14 which generates an output voltage proportional to the diode voltage. This voltage is determined by monitoring the secondary electron energy distribution of the emitted secondary electrons 26. The receiving hardware 16 converts the voltage signal from the sensor 14 to a number corresponding to the actual voltage of the photodiode 22a and supplies this data to the computer 18. At the same time, the circuit control hardware 28 measures the current to the diode 22a under test and also supplies this data to the computer 18.

As is well known to those skilled in the art, if the impacted surface of the diode 22a is raised or lowered in potential, the energy distribution of the emitted secondary electrons 26 will be shifted proportionally. By using an electron energy spectrometer or analyzer 14, such as one employing a retarding field, the shift in the secondary electron energy distribution may be measured and the diode potential may be determined.

Figure 2:
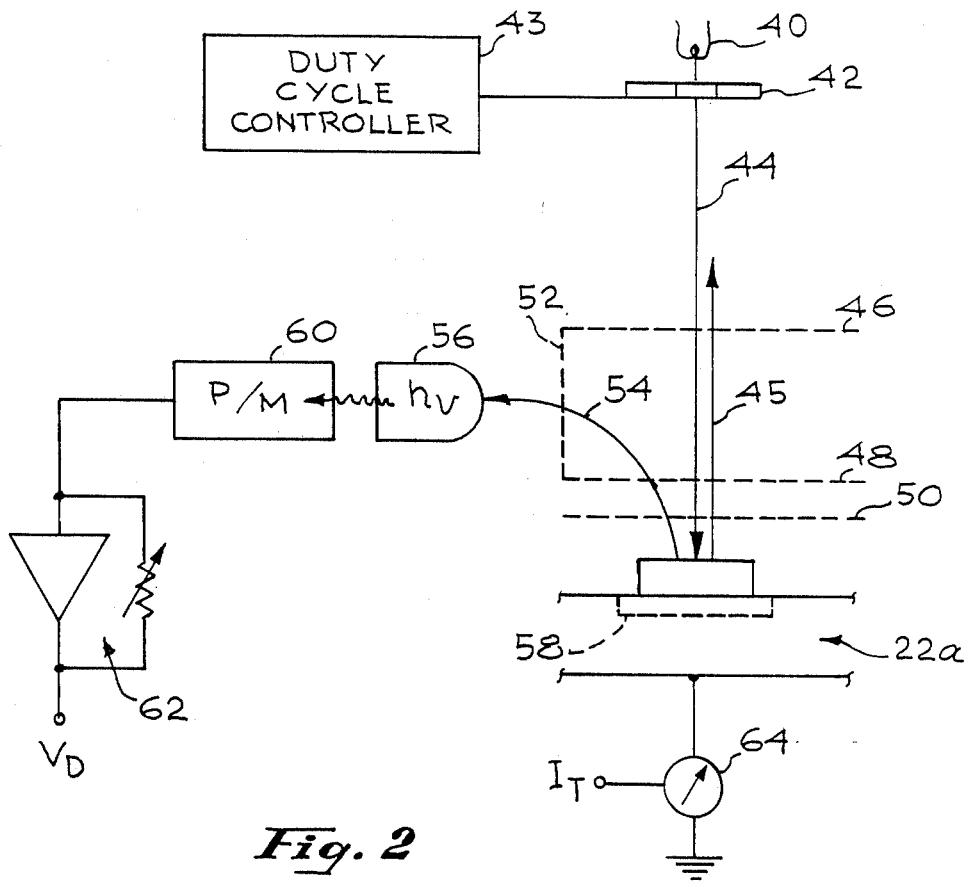
FIG. 2 is a schematic diagram illustrating certain details of the arrangement of FIG. 1.

FIG. 2 illustrates further details of the procedure used in testing a single photodiode 22a. In FIG. 2, an electron source 40 is shown associated with a chopper 42 which includes a duty cycle controller 43 for modulating the incident electron beam, represented by the arrow 44. Broken lines 46, 48 and 50 represent a trap grid, an analyzer grid and an extraction grid, respectively. A deflection grid 52 and a collection grid 58 direct the secondary emission electrons, represented by the curved arrow 54, to a scintillator 56 where they are converted to photons. Photons from the scintillator 56 trigger a photomultiplier 60 and the resultant electrical signal is amplified by a head amplifier 62 to develop the voltage contrast sensor output. Concurrently, a diode sample current $I_T$ is measured by a measuring device 64 in the circuit control hardware 28 (FIG. 1). The arrangement of FIG. 2 illustrates the means by which the secondary electrons are selected by the voltage contrast sensor. The extraction grid 50 overwhelms the localized field of the target and pulls off the secondary electrons while the analyzer grid 48 analyzes the energy distribution of the emitted secondary electrons. The trap grid 46, deflection grid 52 and collection grid 58 all direct the secondary electrons into the scintillator 56 without appreciably affecting the primary beam, while allowing the backscattered electrons (indicated by the arrow 45) to travel back toward the E-beam column final lens.

In the test procedure, the E-beam acts as a current source to each diode under test. Diode bias voltages are sensed by measuring the secondary electron emission energy distribution and converting this information into a voltage reading. Sample diode currents are externally measured to complete the I-V data. The sample diode current $I_T$, measured at 64, is equal to the difference between the primary electron beam current $I_p(44)$ and the secondary and backscatter electron currents $I_S(54)$ and $I_B(45)$.

The equivalent electrical circuit for a photodiode includes parallel resistive and capacitive paths. Thus with successive primary E-beam pulses within the time constant of the equivalent RC circuit, the capacitance of the photodiode charges exponentially, developing progressively increasing values of bias voltage. The E-beam scans a number of photodiodes in succession repetitively, thus building up the bias voltages of the diodes with each scan as the bias voltage and sample current measurements are taken. In this manner the E-beam tester functions as a variable voltage source by varying the bias voltages while diode current is measured, thereby providing the individual data points of sampled current and voltage to develop the I-V characteristic curve of each individual diode, as plotted by the plotter 19.

Figure 3:
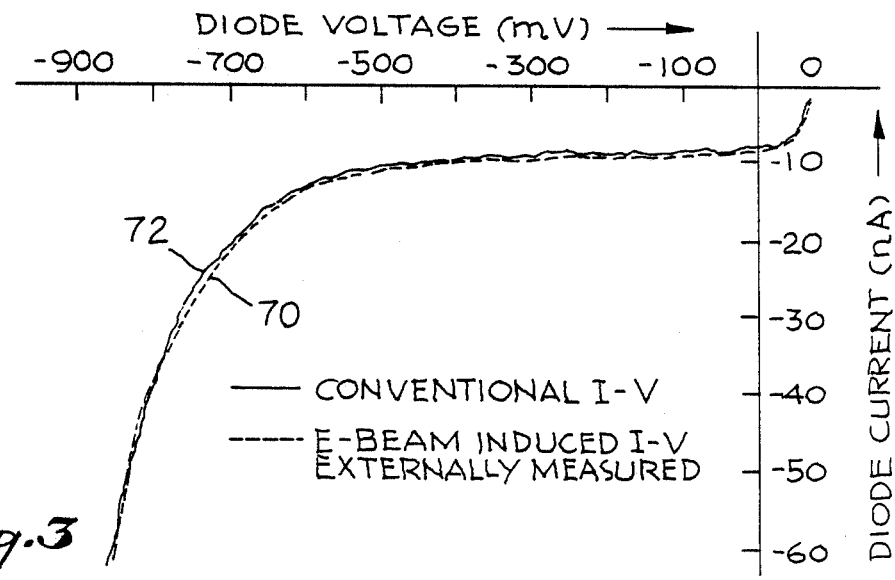
FIG. 3 is a graph showing the results of testing a photodiode with the system of the present invention.

Such a plot of a typical diode in which the depicted curves have been extrapolated from individual I-V point data is shown in FIG. 3. In that figure, the broken line 70 represents a plot of E-beam induced I-V values while the solid line 72 represents a plot of conventionally measured (by direct probe contact) I-V data for comparison. The plot of FIG. 3 illustrates an extremely good correlation over the extent of the curve. The plot in FIG. 3 extends from a diode bias voltage of near −900 mv to the open circuit voltage where the diode current is near zero.

The determination of an I-V curve for a given photodiode 22a, as shown in FIG. 3, can be made by performing the following steps:

1. Apply primary current $I_p$;
2. Measure diode bias voltage $V_D$ from the secondary emission current $I_S$, using an experimentally derived look-up table;
3. Measure diode sample current $I_T$;
4. Plot $I_T$ versus $V_D$;
5. Repeat steps 1 through 4 for other pairs of $I_T$ versus $V_D$.

Figure 4:
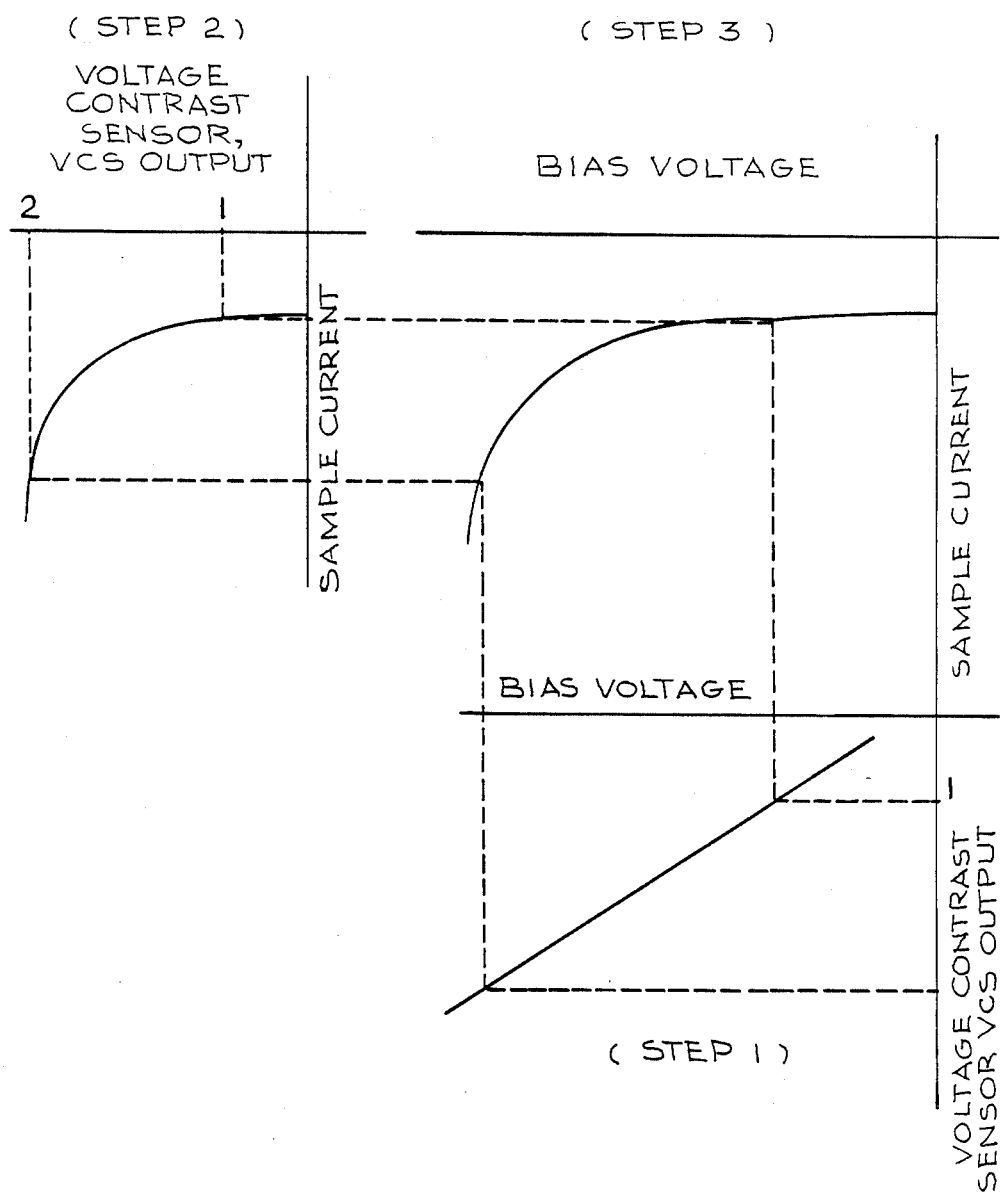
FIG. 4 is a series of diagrams indicating certain steps performed in the practice of the invention.

FIG. 4 illustrates the steps performed by the voltage contrast video data receiving hardware 16 of FIG. 1 in conjunction with the measurement of diode current. In step 1, the voltage contrast sensor output is calibrated with the bias voltage introduced by the E-beam, using results from a reference calibration node. In step 2, measured diode current is correlated with voltage contrast sensor output. In step 3, the voltage contrast sensor output is converted to diode bias voltage according to the calibration from step 1 in order to obtain the I-V curve.

The varying bias voltage of a diode under test, as previously noted, is developed by the E-beam acting as a current source to the diode's effective parallel combination of resistance and capacitance. A measure of the charging time of this combination is given by the product of the resistance and capacitance, simply stated as the RC time constant. The diode is charged from the open circuit voltage to a given diode bias voltage by duty cycle modulating the primary E-beam to an average value capable of sustaining the required voltage drop across the diode resistance. During this irradiation period, the sample diode current $I_T$ flows across the junction to the substrate. Thus diode capacitance and resistance affect the precise time required for the diode testing. Control of this time interval is important, especially for testing a large number of array diodes at low temperatures and low backgrounds, because the effective RC time constant becomes large and therefore longer charge-up time is required for low temperatures and low backgrounds. Conversely, a short testing time is desired for production line testing of large diode arrays. This apparent dichotomy of test considerations is resolved in accordance with an aspect of the invention by controlling the E-beam to repetitively scan a selected series of photodiodes within the array in a timing sequence such that each sampled bias voltage is developed at increased levels of charge along the diode RC charging curve. This process is repeated for different diode bias voltage values by chopping the primary E-beam, through control of the duty cycle of the chopper 42 (FIG. 2). As an alternative approach, the diodes could be charged to the maximum bias voltage and then sampled by E-beam scanning during discharge, but it is preferable to conduct the sampling during the charging of the RC while monitoring the performance of the diode. Using the E-beam scanning procedure for diodes having an effective capacitance of approximately 1 picofarad and an effective resistance of ten gigaohms, the RC time constant is determined to be ten milliseconds. Allowing ten time constants to pass before making the final voltage and current measurement suggests that 100 milliseconds is the minimum measurement time per diode I-V point. Therefore a ten-point diode I-V curve can be acquired in approximately one second.

Figure 5:
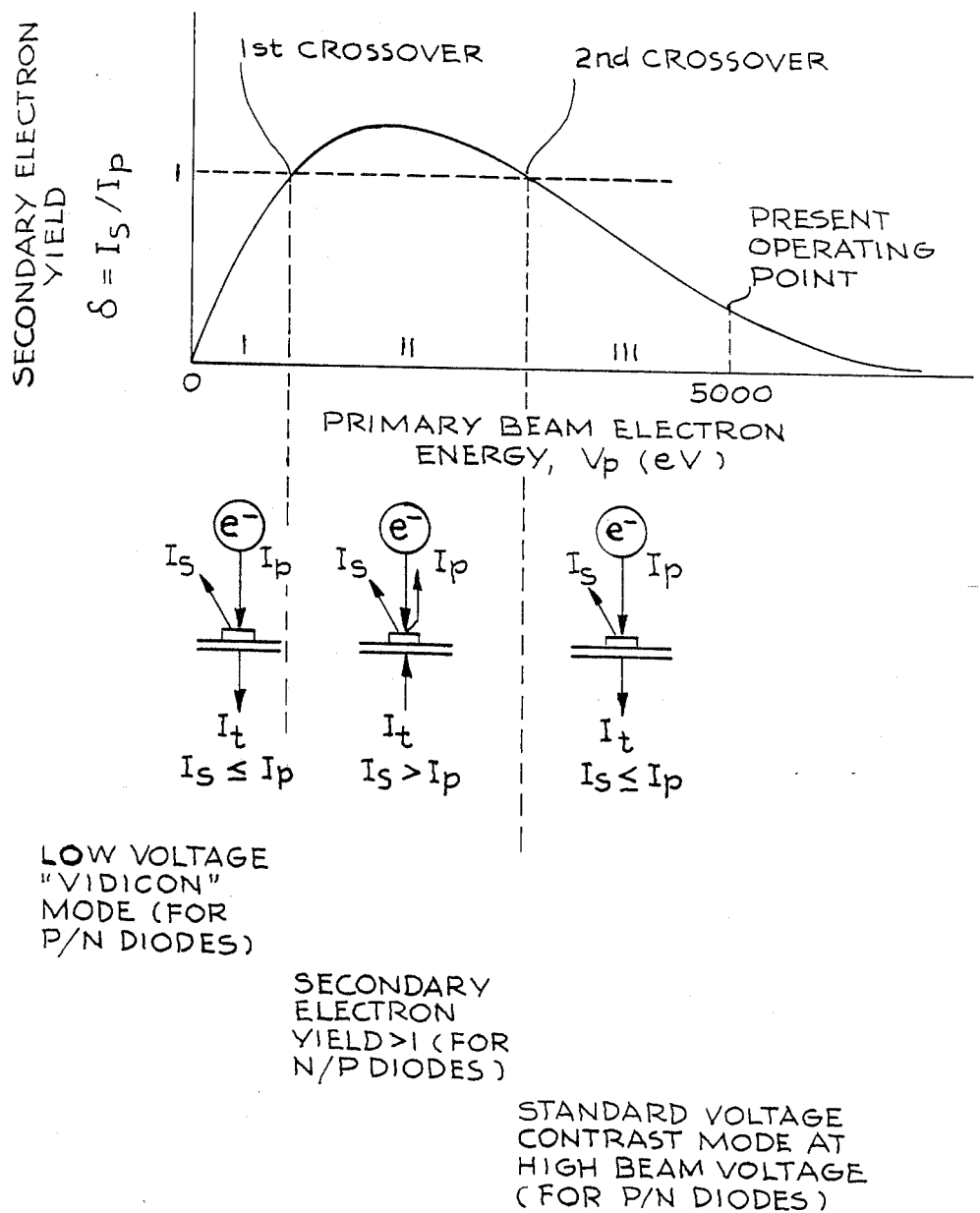
FIG. 5 is a graph indicating three possible modes of E-beam probing of the photodiodes and the preferred operating point for p-on-n diodes for the apparatus of FIG. 1.

FIG. 5 is a plot of secondary electron yield ($\delta = I_s/I_p$) as a function of primary beam electron energy ($V_B$). This curve is divided into three regions, depending on whether the secondary electron yield is less than or greater than 1, indicating three possible modes of E-beam probing of the photodiodes. Since most infrared photodiodes are operated in the reverse bias region, the preferred mode of operation is to use region III for p-on-n diodes, such as InSb infrared diodes. The operating point was set at 5000 electron volts of primary beam energy. Selection of the operating point in this region at 5000 electron volts provides significantly better results from the standpoint of linear fit of the data than lesser values, such as 2500 electron volts, where the results are degraded due to contamination build-up. Operating at 5000 electron volts provides satisfactory spatial resolution, voltage resolution and penetration of surface contamination while developing sufficient secondary electron current for reliable testing.

Region I of FIG. 5 corresponds to the low-voltage "Vidicon" mode which is also of interest, since most of the secondary electron energy lies in this region. This region is also applicable for p-on-n diodes.

Region II, where secondary electron yield is greater than 1, is the region where more secondary electrons are generated than primary electrons injected. This region can be used to forward-bias p-on-n diodes or to reverse-bias n-on-p diodes. This region is of interest for present day HgCdTe photodiodes which are fabricated in this junction configuration.

In the I-V testing procedure, registration marks are used to precisely locate the E-beam apparatus relative to a target. These marks are strategically positioned on the photodiode array and are utilized in positioning the array relative to the E-beam apparatus prior to initiating the test procedures. These marks are preferably made of two dissimilar materials to provide a topographic and secondary yield variation for enhanced contrast. In the preferred embodiment of the invention, nickel against $SiO_2$ was chosen, since it is included in most photodiode array chips. One particular arrangement which has worked well involves the placing of two registration marks, each in the form of a cross of approximately ten microns width and 100 microns arm length, within a scan field of approximately $2 \times 2$ mm. In another example, the cross mark had an arm width of 20 microns and an arm length of 71 microns. The nickel against silicon dioxide registration mark provides an excellent contrast and is readily discernible.

The system of the present invention utilizes commercially available equipment for its operation. The electron beam generator 10 including the electron source 40, the chopper 42, beam position control hardware 12 with focusing and deflection coils 12a, 12b, the vacuum system in which the testing is performed, and the associated controls for this equipment are all embodied in a Cambridge S150 scanning electron microscope which is commercially available and is well known among workers skilled in this art. The computer 18 is a Digital Equipment Corporation PDP11/34 Minicomputer.

The secondary electron energy analyzer or sensor 14 is preferably a sensor developed by Siemens A. G. of West Germany. This sensor has been described in *Scanning Electron Microscopy* by Feuerbach, Vol. 1, 1979, pp. 285–318, FIG. 5, p. 290 and by Fazekas et al, "Scanning Electron Beam Probes VLSI Chips", *Electronics*, July 14, 1981, pp. 105-112 at p. 109, FIG. 5.

There has thus been shown and described hereinabove one particular arrangement in accordance with the invention for testing photodiode arrays without directly contacting the photodiodes, utilizing an E-beam probe. By chopping the beam and taking repetitive measurements of bias voltage and diode current, a succession of I-V data points is derived which is used by the computer to develop the desired I-V curve. By scanning a number of photodiodes in sequence while the repetitive measurement procedure continues, an entire array of photodiodes may be tested within a relatively short time interval, thus providing a procedure which is appropriate for production line use. The E-beam testing procedure serves to standardize the testing parameters, thereby eliminating variations previously introduced by individual operators, and lends itself readily to automation with the attendant improvement in through-put capability and reliability of result.

Although there has been described above one specific arrangement of improved apparatus for electron-beam probing of photodiodes in accordance with the invention for the purpose of illustrating the manner in which the invention may be used to advantage, it will be appreciated that the invention is not limited thereto. Accordingly, any and all modifications, variations or equivalent arrangements which may occur to those skilled in the art should be considered to be within the scope of the invention as defined in the annexed claims.

What is claimed is:

1. Photodiode testing apparatus comprising:
    electron beam control means for charging the parallel resistance and capacitance of a photodiode during a selected time interval;
    secondary emission electron means for measuring the voltage of the photodiode at predetermined times within said interval;
    means for measuring photodiode current at said times;
    means for correlating the corresponding measurements of photodiode voltage and current to derive a plurality of data points relating thereto; and
    means for determining a current-voltage curve for the photodiode from the derived data points.

2. The apparatus of claim 1 wherein the electron beam control means include means for successively irradiating the photodiode for limited periods of time during the selected time interval.

3. The apparatus of claim 2 wherein the electron beam control means comprise apparatus for modulating an electron beam to control the irradiation of the photodiode.

4. The apparatus of claim 3 wherein the modulating apparatus further includes means for repetitively scanning a selected plurality of photodiodes within an extended photodiode array, and wherein the respective voltage and current measuring means measure the voltage and current of each separate diode of the selected plurality each time the photodiode is scanned.

5. The apparatus of claim 4 wherein the scanning means are operable to scan each of the selected plurality of photodiodes a plurality of times within a time interval not exceeding the period corresponding to the RC time constant of the photodiode.

6. The apparatus of claim 3 wherein the modulating apparatus is operable to develop a different photodiode voltage each time the voltage is measured.

7. The apparatus of claim 3 wherein the voltage measuring means include means for measuring photodiode voltage without directly contacting the photodiode.

8. The apparatus of claim 7 wherein the voltage measuring means comprise a voltage contrast sensor positioned to respond to secondary emission electrons from the photodiode and provide a signal corresponding to detected secondary emission electrons.

9. The apparatus of claim 8 wherein the voltage contrast sensor comprises a scintillator providing a photon output in response to the detection of secondary emission electrons, a photomultiplier positioned to receive said photons from the scintillator, and an amplifier coupled to the photomultiplier for providing a corresponding voltage contrast output signal.

10. The apparatus of claim 9 further including means for converting the voltage contrast signal to a bias voltage signal in accordance with a predetermined calibration between voltage contrast sensor output and E-beam induced bias voltage.

11. Apparatus for testing a plurality of photodiodes in a photodiode array comprising:
    means for repetitively scanning a selected plurality of photodiodes in said array by irradiating each of the selected diodes in succession with an electron beam for a selected time interval, wherein each repeated scan of a given photodiode develops a photodiode voltage proportional to the diode irradiation duty cycle;
    means for measuring secondary electrons emitted from each of the scanned photodiodes in succession to provide a measurement of diode voltage;
    means for measuring individual photodiode current in each of the selected photodiodes concurrently with the measurement of diode voltage; and
    means for correlating corresponding voltage and current measurements to derive a plurality of data points corresponding to individual voltage and current measurements in order to develop a current voltage characteristic for each of the diodes being measured.

12. The apparatus of claim 11 wherein the scanning means include means for selectively controlling the individual diode irradiating time interval by varying the scanning means duty cycle.

13. The apparatus of claim 12 wherein the scanning means is operable to develop a photodiode voltage at the end of each illuminating time interval which is greater than the photodiode voltage developed at the end of the preceding irradiating time interval for that diode.

14. The apparatus of claim 11 wherein the secondary electron measuring means comprise a scintillator for generating a photon output signal corresponding to secondary electron emission, a photomultiplier positioned to receive said photon output signal from the scintillator, and an amplifier coupled to the photomultiplier for providing a corresponding voltage contrast output signal.

15. The apparatus of claim 14 further including means for converting the voltage contrast output signal to a diode voltage signal in accordance with a predetermined calibration between voltage contrast output and electron beam induced voltage.

16. The method of testing an array of elements to determine the current-voltage characteristic of each element, wherein each element has an inherent effective resistance and capacitance, the method comprising:

directing an E-beam to scan each element in turn;

limiting the time duration of irradiation of each element during a given scan to an interval which is only a minor portion of the charging time constant of the element;

measuring individual element voltage by detecting secondary emission electrons from each irradiated element at the end of said interval;

measuring current through each element at the end of each interval;

respectively scanning each of the elements within a time period succeeding the initial scan which is less than the discharge time constant of the elements;

repeating the steps of measuring voltage and current for each successive scan; and correlating the successive measurements of voltage and current for each individual element to develop a current-voltage characteristic for each element over a range of varying voltages and currents.

17. The method of claim 16 wherein the step of limiting the time duration of irradiation includes chopping the E-beam at predetermined intervals.

18. The method of claim 16 wherein the step of measuring individual element voltage includes generating photons upon detecting secondary emission electrons and applying the photons to a photomultiplier to develop a voltage contrast sensor signal.

19. The method of claim 18 further including the step of converting the voltage contrast sensor signal to a bias voltage signal in accordance with a predetermined calibration relationship between the voltage contrast sensor signal and actual measured bias voltage.

20. The method of claim 16 wherein the elements are photodiodes.

* * * * *